Oct. 17, 1950 R. E. MUMMA Re. 23,285
ELECTRONIC DEVICE
Original Filed Jan. 27, 1944
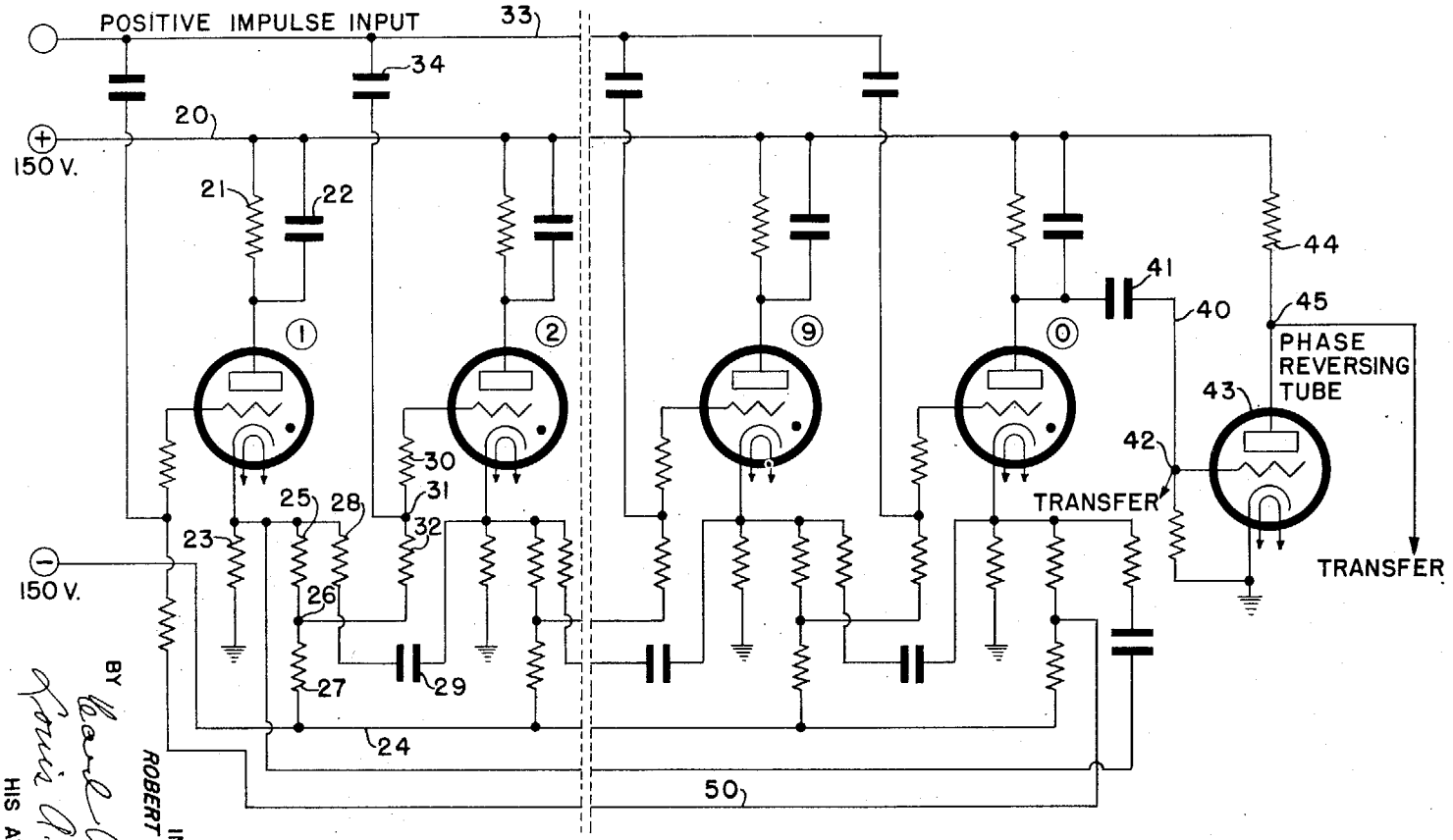
INVENTOR
ROBERT E. MUMMA
BY Earl Benesch
Louis A. Kline
HIS ATTORNEYS Reissued Oct. 17, 1950

Re. 23,285

UNITED STATES PATENT OFFICE 23,285

ELECTRONIC DEVICE

Robert E. Mumma, Dayton, Ohio, assignor to The National Cash Register Company, Dayton, Ohio, a corporation of Maryland Original No. 2,422,583, dated June 17, 1947, Serial No. 519,851, January 27, 1944. Application for reissue July 22, 1950, Serial No. 175,441

4 Claims. (Cl. 250—27)

Matter enclosed in heavy brackets [ ] appears in the original patent but forms no part of this reissue specification; matter printed in italics indicates the additions made by reissue

This invention relates to electric impulse counting rings of electron tubes of the gaseous discharge type, and more particularly pertains to means for creating one impulse at the anode of a tube of the ring for each full operation of the ring which provides a source of impulses for interdenominational carry-overs between one denominational ring and another.

In such electron tube counting rings, the tubes are rendered conducting one at a time in endless chain sequence in response to electric impulses commonly impressed thereon, one tube being fired and one extinguished for each impulse.

The counting rings under consideration are those employing gaseous discharge electron tubes for representing the digits of a denomination. Each digit tube has at least an anode, a cathode, and a control grid that has its ordinary controlling potential primed to near the firing point when conduction occurs in the next preceding tube of the ring. Such priming requires a positive rise in potential of the grid, having its source in the conduction of the said next preceding tube, and it will be seen that such can only be obtained by connection to the cathode end of a resistor in the cathode potential supply connections of said preceding tube. As a tube fires, it is also necessary by that act to cause the extinguishment of the preceding tube of the ring in order that but one tube in a ring is conducting at any one time to represent the accumulation of data. Several methods of extinguishing the preceding tube are available, but none heretofore known lend themselves to producing a transfer potential impulse only at the anode of a tube of the ring. One extinguishing method, set forth in my co-pending application for United States Letters Patent jointly with Joseph R. Desch, Serial No. 325,040, filed March 20, 1940, is of the type wherein the cathodes are connected in a chain by electrostatic coupling, so that, as a tube fires and becomes conducting, the rise in potential of the cathode not only primes the succeeding tube, but, through the electrostatic coupling between the cathodes of the tubes, forces the cathode of the preceding conducting tube up, momentarily, until it passes the anode potential, causing said preceding tube to be extinguished. An attempt to insert a resistance in the anode supply connections of the last tube of such a ring to obtain a drop in the anode potential as the tube commences conduction for transfer purposes would rob the cathode rise in potential of its strength and prevent the extinguishment of the next to last tube.

The same is true of the type of ring shown in my co-pending application for United States Letters Patent, Serial No. 396,505, filed June 4, 1941, which issued on July 30, 1946, as Patent No. 2,405,096 and which discloses the cathodes coupled in parallel electrostatically to a common extinguishing conductor.

Other types of inter-tube extinguishing require a temporary depression of the potential of a common anode supply conductor as disclosed in my co-pending application for United States Letters Patent, Serial No. 395,995, filed May 31, 1941, which issued as Patent No. 2,401,657 on June 4, [1926] *1946*, but such common anode supply conductor potential change, occurring as many times during a complete operation of a ring as there are tubes in the ring, cannot be used as a source of an anode transfer impulse, which must occur but once each complete ring cycle.

The present invention solves the problem of supplying an anode transfer impulse in a ring using the chain coupled cathode type of extinguishing by inserting in the anode supply conductor to each tube of the ring a resistance shunted by a capacitor. As a tube fires, the anode capacitor charges, causing the cathode to rise in potential momentarily to within about 15 volts of the common anode supply conductor potential, the 15 volts representing the anode-cathode potential of a conducting gaseous tube. This produces the necessary strong extinguishing impulse on the inter-tube chain cathode electrostatic coupling circuit. After the anode capacitor charges, the individual anode resistor for the tube assumes the load, causing the anode to drop in potential, the anode resistor and the cathode resistor determining at that time the steady priming effect on the grid of the succeeding tube of the ring. The circuit elements must be adjusted in value so that the extinguishing impulse does not fire any non-conducting tube sporadically in the absence of an input impulse, yet so that the succeeding tube to a conducting tube, with its anode capacitor charged, will be primed to be fired by an input impulse. The circuit elements of all the tubes of the disclosed ring are made the same, and for that reason a transfer impulse may be taken from the anode of any tube in the ring, or in other words any tube of the ring may be used as the last tube of the ring.

The gaseous discharge tubes used for members of the ring are of the ordinary thermionic cathode, grid-controlled type having an internal resistance drop of about 15 volts when conducting and requiring a grid potential more positive than about 12 volts negative with respect to the cathode, at the anode-cathode potential specified, to cause them to fire. These values are relative only, and other values giving similar relationships may be used. The heater circuits of the cathodes are shown conventionally. Neither is the invention restricted to the use of thermionic cathode gaseous triodes, as tubes of other structure and characteristics may be used.

Therefore, it is an object of the invention to provide an electron tube counting ring wherein the anode of a tube is given a strong potential excursion each time conduction occurs in the tube.

Another object of the invention is to provide denominational electron tube counting rings from which denominational transfer impulses can be obtained at the anode of the last tube of the ring.

Another object of the invention is to provide an electron tube counting ring, for counting electric potential impulses commonly impressed in the tubes of the ring, having means causing a potential excursion at the anode of a tube of the ring only at the time it commences or ceases conduction.

With these and incidental objects in view, the invention includes certain novel features of construction and combinations of elements and circuits, the essentials of which are set forth in appended claims and a preferred form or embodiment of which is hereinafter described with reference to the drawing which accompanies and forms a part of this specification.

The drawing discloses the circuits for a decimal denominational counting ring with an added tube for controlling the phase of the transfer impulse. Parts of the repeated pattern of the circuit have been omitted to simplify the drawing.

Each of ten gaseous triodes representing the digits "1," "2," "3," "4," "5," "6," "7," "8," "9," and "0" of a decimal denominational order (tubes "1," "2," "9," and "0" only being shown in the drawing) has its anode coupled to a 150-volt positive supply conductor 20 through a 15,000-ohm resistor, like resistor 21, shunted by a .001-microfarad capacitor, like capacitor 22. Each cathode is shown connected to ground on one side through a 15,000-ohm resistor, like resistor 23, and connected on the other side to a negative 150-volt supply conductor 24 through a resistor of 100,000 ohms, like resistor 25, a point, like point 26, and a 125,000-ohm resistor, like resistor 27. The cathode of each tube is connected to the cathode of the tube of next higher value in the ring through an oscillation-repressing resistor of 5,000 ohms, like resistor 28, in series with a capacitor of .0005 microfarad, like capacitor 29. The grid of each tube is connected, through a 50,000-ohm resistor, like resistor 30, a point, like point 31, and a 500,000-ohm resistor, like resistor 32, to a point, like point 26, in the negative supply leg of the cathode potential supply divider of the preceding tube of the chain. The connection of the grid of the "2" tube to point 26, just described, for example, causes the "2" tube to be primed when the "1" tube is conducting because of current flow through resistor 27. The grid of each tube, moreover, is connected to common input impulse conductor 33 through a capacitor of 10 micro-microfarads, like capacitor 34, from a point, like point 31, in its priming circuit. The values given provide a controlling potential for the grid of a tube when the preceding tube of the ring is non-conducting, and give such grid a lesser controlling potential when the preceding tube is conducting, thus priming it. Positive potential impulses impressed on conductor 33 of such value as will discriminate, so as to fire a primed tube and not an unprimed tube, will cause the tubes to fire one after another in sequence.

As a tube fires and becomes conducting, the cathode momentarily rises in potential to a point within about 15 volts of the potential of the anode supply conductor 20, gradually falling off as the associated anode capacitor charges, to a point determined by the division of the anode and cathode resistances. The initial rise in potential of the cathode of a firing tube is impressed through the intercathode capacitors, such as capacitor 29, extinguishing the preceding conducting tube, whose anode has fallen in potential after its anode capacitor has become charged.

As the cathode potential of a tube commencing to conduct subsides to the intermediate point determined by the anode and cathode resistances, such potential drop creates the desired source of an anode potential impulse. This drop in anode potential occurs for any given anode only once for each complete operation of a ring, such drop occurring when the associated tube fires.

If the transfer is to take place on the first impulse received after the "9" tube is conducting, which is the usual practice in the decimal number system, a conductor, like conductor 40, is connected through a capacitor of .0001 microfarad, like capacitor 41, to the anode of the "0" tube, which is rendered conducting by the said next impulse. A point like point 42 will then receive a negative potential impulse on the event of the tube "0" firing. This negative impulse may be used to render a normally zero-biased phase-reversing high-vacuum electron tube 43 non-conducting by causing its grid to become temporarily negative. A resistance 44 in the anode supply of tube 43 causes a positive impulse to appear at point 45 when tube 43 becomes non-conducting, which positive impulse may be impressed on the input conductor of the next higher bank of tubes. Obviously, the phase-reversing tube 43 is not necessary when a negative impulse can be utilized for transferring.

The ring circuit is completed by conductor 50 connecting the cathode of the "0" tube to the control grid of the "1" tube in the usual manner.

While the form of the invention herein shown and described is admirably adapted to fulfill the objects primarily stated, it is to be understood that it is not intended to confine the invention to the one form or embodiment herein disclosed, for [its] *it* is susceptible of embodiment in various forms, all coming within the scope of the claims which follow.

What is claimed is:

1. In combination, a plurality of gaseous discharge electron tubes each having at least an anode, a cathode, and a control grid; means connecting the anode of each tube to a source of anode potential through a resistance shunted by a capacitor; a potentiometer for each cathode connected on one side to a source of negative potential supplying each associated cathode with operating potential; means connecting the grid of a tube to a point in the cathode potentiometer of another tube of the plurality between the cathode and the source of negative potential to form an endless operating chain of tubes; and means coupling the cathodes of each two adjacent tubes of the ring electrostatically.

2. In combination, a plurality of gaseous discharge electron tubes each having at least an anode, a cathode, and a control grid; means connecting the anode of each tube to a source of anode potential through a resistance shunted by a capacitor; a potentiometer for each cathode connected on one side to a source of negative potential and supplying each associated cathode with operating potential; means connecting the grid of a tube to a point in the cathode potentiometer of another tube of the plurality between the cathode and the source of negative potential to form an endless operating chain of tubes; means coupling the cathodes of each two adjacent tubes of the ring electrostatically; and means electrostatically coupling each grid separately to a common conductor for input impulses.

3. In combination, a plurality of gaseous discharge electron tubes each having at least an anode, a cathode, and a control grid; means connecting the anode of each tube to a source of anode potential through a resistance shunted by a capacitor; a potentiometer for each cathode connected on one side to a source of negative potential and supplying each associated cathode with operating potential; means connecting the grid of a tube to a point in the cathode potentiometer of another tube of the plurality between the cathode and the source of negative potential to form an endless operating chain of tubes; means coupling the cathodes of each two adjacent tubes of the ring electrostatically; means electrostatically coupling each grid separately to a common conductor for input impulses; and an output conductor and means coupling said output conductor electrostatically to the anode of one of the tubes of the ring.

4. In combination, a plurality of gaseous discharge electron tubes each having at least an anode, a cathode, and a control grid; means connecting the anode of each tube to a source of anode potential through a resistance shunted by a capacitor; a potentiometer for each cathode connected on one side to a source of negative potential and supplying each associated cathode with operating potential; means connecting the grid of a tube to a point in the cathode potentiometer of another tube of the plurality between the cathode and the source of negative potential to form an endless operating chain of tubes; means coupling the cathodes of each two adjacent tubes of the ring electrostatically; means electrostatically coupling each grid separately to a common conductor for input impulses; an output conductor; means coupling said output conductor electrostatically to the anode of one of the tubes of the ring; and a phase reversing means comprising a normally conducting grid controlled high vacuum electron tube to whose grid the output conductor is connected, the anode of said vacuum tube being connected through a resistance to a source of anode potential, and also connected with a second output conductor, so that the second output conductor receives a positive impulse when the vacuum tube is rendered non-conducting.

ROBERT E. MUMMA.

REFERENCES CITED

The following references are of record in the file of this patent or the original patent: and in the parent case.

UNITED STATES PATENTS

| Number | Name | Date |
|---|---|---|
| 1,932,589 | Holden | Oct. 31, 1933 |
| 2,099,065 | Holden | Nov. 16, 1937 |
| 2,136,621 | King et al. | Nov. 15, 1938 |
| 2,146,862 | Shumard | Feb. 14, 1939 |
| 2,289,320 | Collom | July 7, 1942 |